United States Patent [19]

Hennessey

[11] Patent Number: 4,957,603
[45] Date of Patent: Sep. 18, 1990

[54] OPTICAL MEMORY DISC MANUFACTURE

[75] Inventor: Michael E. Hennessey, Detroit, Mich.

[73] Assignee: Producers Color Service, Inc., Southfield, Mich.

[21] Appl. No.: 425,285

[22] Filed: Oct. 23, 1989

[51] Int. Cl.$^5$ .............................................. C23C 14/34
[52] U.S. Cl. .......................... 204/192.27; 204/192.14; 204/192.15; 204/192.26
[58] Field of Search ...................... 204/192.14, 192.15, 204/192.16, 192.22, 192.26, 192.27, 192.29

[56] References Cited

U.S. PATENT DOCUMENTS

| | | | |
|---|---|---|---|
| 4,374,717 | 2/1983 | Drauglis et al. | 204/192.14 |
| 4,525,261 | 6/1985 | Hotta et al. | 204/192.15 |
| 4,551,216 | 11/1985 | Argyo | 204/192.15 |
| 4,663,008 | 5/1987 | Takeoka et al. | 204/192.15 X |
| 4,802,967 | 2/1989 | Kittler | 204/192.15 X |

*Primary Examiner*—Nam X. Nguyen
*Attorney, Agent, or Firm*—Barnes, Kisselle, Raisch, Choate, Whittemore & Hulbert

[57] ABSTRACT

A method of making an optical memory disc replica that includes the steps of injection molding a PMMA substrate having a surface with information recorded thereon as a series of surface undulations, and depositing a film of optically reflective metallic construction over the information surface such that the information recorded on the surface may be optically read through the substrate as a function of reflectivity from the film. The reflective film is sputter-deposited onto the information surface in the presence of carbon at said surface in excess of that in the polymer molecular structure by subjecting the surface to a plasma that includes carbon-rich ions to prepare the surface for chemical bonding with the metal of the film and the underlying substrate.

6 Claims, No Drawings

OPTICAL MEMORY DISC MANUFACTURE

The present invention is directed to deposition of films on polymeric substrates, and more particularly to manufacture of optical memory discs having a reflective metallic film deposited on the polymeric information surface of a disc substrate.

Manufacture of optical memory discs—e.g., video discs and compact audio discs—conventionally involves formation of a metal stamper from a master recording having desired information recorded thereon, placement of the stamper into an injection molding machine, and mass production of molded replica discs having the information stored on one flat surface as a series of surface undulations. A film of optically reflective construction, such as aluminum, is deposited on the information surface, and the reflective film is covered by a suitable protective layer. Thereafter, the information stored on the disc surface may be optically read through the polymer substrate as a function of reflections from the metallic film. A double-sided disc is formed by securing two single-sided discs, of the type described, with the protective layers back-to-back. Disc manufacturing processes of the described character are disclosed, for example, in U.S. Pat. Nos. 4,422,904 and 4,310,919.

An injection-molded replica video disc substrate is typically of integral polymeric construction, usually polymethylmethacrylate or PMMA. Conventionally, the reflective metallic film is placed on the flat substrate information-bearing surface in a vapor deposition operation. Such evaporative deposition operations are typically batch processes. Although it has heretofore been suggested that the deposited film may be formed in a sputter deposition process, which is more amenable to automated mass production and enhanced control of film characteristics, sputter deposition processes are often not commercially employed because of problems associated with adhesion of the film to the substrate surface. Specifically, metal films deposited on PMMA substrates in accordance with conventional sputter deposition processes have been found to exhibit very poor sputtered film to substrate surface adhesion properties, thereby vitiating what might otherwise be advantages of employing sputter deposition in mass production of commercial optical memory discs, such as video discs.

It is therefore desirable to provide a method of manufacturing optical memory discs in which sputter deposition of the reflective film onto the polymeric information-bearing surface can be automated in such away as to control more precisely the physical and optical properties of the film, thereby both reducing manufacturing costs and enhancing product quality.

It has been recognized that the problem of adhesion of a sputter-deposited film on a polymeric substrate such as PMMA is related to subjection of the substrate surface to the radiation inherent in the sputter deposition process itself. That is, the ions, electrons and electromagnetic radiation of the plasma, typically an inert gas such as argon, bombard, rupture and modify the molecular structure of the polymeric surface without chemically preparing the modified surface molecules for bonding the deposited film to the underlying unmodified polymeric layer. In the specific case of PMMA, it is believed that the radiation destabilizes the side ester groups of the PMMA molecular chain, which ultimately contributes to fracture the polymer chain. See Lehockey et al, "The Radiation Chemistry of Poly(methyl methacrylate) Photo Resists," *J. Vac. Sci. Tech.*, Vol. 8, No. 4 (1988) pages 2221–2225, and Moore et al, "Radiation-Induced Structural Changes in PMMA," *Polymer Preprints*, Vol. 30, No. 1 (April 1989) pages 335–336.

It has been discovered in accordance with the present invention that inclusion of excess carbon (i.e., free carbon or carbon-bearing molecules) at the polymer surface, either prior to or during the actual sputter deposition process, chemically prepares the polymer molecules altered by plasma exposure for bonding the film deposited on the substrate surface to the bulk of the substrate, thereby greatly enhancing adhesion of the sputter-deposited film. Although the mechanism through which the invention operates to obtain these enhanced properties is not fully understood at this time, it is believed that the presence of excess carbon while the substrate is being exposed to a high energy plasma effectively modifies the polymer surface in such a way that the modified doped layer can bond to the sputter-deposited film and to the underlying bulk polymer. That is, the addition of excess carbon to the plasma-induced chemical reaction zone is believed to help create an interface polymer that reduces adhesion loss between a subsequently sputter-deposited layer and the bulk of the PMMA substrate.

Placement of carbon dopant into the substrate surface may be accomplished in a number of ways in accordance with the present invention. The substrate may be pretreated by subjection to a plasma that includes carbon ions (i.e., free carbon ions or carbon-bearing ions)—such as a mixed methane/argon plasma—prior to the sputtering operation. This technique has been found to yield excellent results. In a presently preferred implementation of the invention, surface preparation is carried out through a plasma pretreatment under a mixed atmosphere of about 40% methane and 60% argon. Alternatively, the substrate surface may be presputtered with graphite. The sputtering operation itself may be performed using a mixed methane/argon sputtering gas, so that the beneficial surface modification and the sputter deposition take place simultaneously. In practicing the latter alternative implementation of the invention, nickel rather than aluminum was employed as the sputtered metal. It has even been found, contrary to conventional expectations, that placement of certain ordinary oils on the substrate surface prior to sputter deposition actually increases film adhesion.

In development of the invention, the quality of film adhesion was tested using a generally conventional "tape peel" tester. Both "break-away" and "constant peel rate" forces were initially monitored. Although test films sputter-deposited according to conventional techniques generally exhibited low break-away strength, it was found that the break-away strength of films deposited in accordance with the present invention often exceeded the bond strength of the tape to the test sample. Break-away separation was therefore initiated manually, and "constant peel rate" adhesion was thereafter monitored for comparison purposes among the various test samples.

Test PMMA substrates were subjected to a plasma pretreatment in which the only variable was the ratio of methane to argon in the ionized gas. A range of 0% to 100% methane was employed for test purposes. The test substrates were subsequently sputter coated with aluminum using a standard d.c. magnetron (Sputtered Films, Inc. research S-gun system) with argon as the sputtering gas. Adhesion testing of these films showed that the "constant peel rate" adhesion of the aluminum layer increased as the percentage of methane increased in the pretreatment plasma. Test substrates pretreated at 40% methane and 60% argon exhibited a 10:1 improvement in adhesion as compared with control samples that received no pretreatment.

Similar results have been obtained by pre-sputtering graphite onto test PMMA substrates prior to sputter deposition of a metallic film. In yet another test implementation of the invention, a graphite secondary target was mounted in the sputter gun assembly while the PMMA substrate was being subjected to an argon/methane plasma pretreatment. This pretreatment with an argon/methane plasma, while simultaneously sputter-depositing carbon, resulted in dramatically improved adhesion between a subsequently sputter-deposited aluminum layer and the underlying PMMA substrate. The peel strength of these samples exceeded the capabilities of the peel tester. As a further test of these samples, a 2 mm by 2 mm cross hatch pattern was scribed into the film surface using a razor blade. These cross hatched areas were then adhesion tested, and again exceeded the capabilities of the peel tester. These samples exhibited more than a 30:1 adhesion improvement over the non-pretreated control samples. In addition, the optical properties of the substrate and sputter-deposited reflective layer were completely compatible with the requirements of commercially produced video discs and compact audio discs.

Although the invention has been described in conjunction with replicated optical memory discs of PMMA construction, it will be recognized that the principles of the invention have wider application. For example, the invention is by no means limited specifically to discs of PMMA construction, but may be employed in conjunction with substrates of other polymers that exhibit radiation (uv, x-ray, gamma ray, ion, electron) characteristics similar to those of PMMA previously described. In this respect, the invention may be employed in sputter depositing films onto master discs and DRAW discs on which a layer of polymeric photoresist forms an information surface on a substrate of glass or PMMA. Indeed, it is envisioned that the principles of the invention may find utility in any application where it is desired to employ a sputter deposition process to deposit a film onto a polymeric substrate.

I claim:

1. In a process for manufacture of an optical memory disc that includes the steps of providing a PMMA disc substrate having an integral surface with information recorded thereon as a series of surface undulations, and sputter depositing a film of optically reflective metallic construction onto said surface such that said information recorded on said surface is adapted to be optically read through said substrate as a function of changes in effective reflectively from said film caused by said surface undulations, a method of improving adhesion between said film and said substrate comprising the steps of: (a) modifying said substrate surface by subjecting said surface to radiation in the presence of carbon at said surface, in excess of that in the surface PMMA molecular structure, as a pretreatment to said surface before sputter deposition of said metallic film so as to alter effects of degradation and depolymerization at said surface due to radiation during said sputter deposition and chemically prepare degraded and depolymerized molecules at said surface for bonding said film to that portion of said substrate underlying said surface, and (b) sputtering said metal film directly onto the substrate surface chemically modified in said step (a) so as to form a layered substrate/film structure that consists essentially of said reflective metallic film, said underlying substrate and said chemically modified substrate surface bonding said film to said underlying substrate.

2. The method set forth in claim 1 wherein said excess carbon is placed on said surface by subjecting said surface to an ionized atmosphere that includes carbon-rich ions.

3. The method set forth in claim 2 wherein said carbon-rich ions are selected from the group consisting of ions of methane and graphite.

4. The method set forth in claim 2 wherein said ionized atmosphere comprises about 40% methane and 60% argon.

5. The method set forth in claim 1 wherein said excess carbon is placed on said surface by coating said surface with carbon-rich material prior to said sputter-deposition, and thereafter subjecting said surface to said radiation during said sputter-deposition such that a portion of the carbon molecules in said coating chemically bind with degraded and depolymerized molecules of said substrate surface.

6. The method set forth in claim 5 wherein said step of coating said surface comprises the step of sputter depositing a layer of carbon on said surface.

* * * * *